US009278375B2

(12) United States Patent
Angle et al.

(10) Patent No.: US 9,278,375 B2
(45) Date of Patent: Mar. 8, 2016

(54) ULTRASONIC TRANSDUCER CONTROL

(71) Applicant: uBeam Inc., New York, NY (US)

(72) Inventors: Matthew Angle, Cambridge, MA (US); Marc Berte, Ashburn, VA (US)

(73) Assignee: uBeam Inc., Santa Monica, CA (US)

(*) Notice: Subject to any disclaimer, the term of this patent is extended or adjusted under 35 U.S.C. 154(b) by 245 days.

(21) Appl. No.: 13/837,479

(22) Filed: Mar. 15, 2013

(65) Prior Publication Data

US 2014/0265943 A1 Sep. 18, 2014

(51) Int. Cl.
*H01L 41/09* (2006.01)
*B06B 1/02* (2006.01)

(52) U.S. Cl.
CPC ........... *B06B 1/0207* (2013.01); *B06B 2201/51* (2013.01); *B06B 2201/55* (2013.01)

(58) Field of Classification Search
CPC ....... B06B 1/0622; G10K 11/02; H04R 17/00
USPC .......................................... 310/317, 322, 334
See application file for complete search history.

(56) References Cited

U.S. PATENT DOCUMENTS 3,946,831 A 3/1976 Bouyoucos
6,037,704 A 3/2000 Welle
6,127,942 A 10/2000 Welle
6,798,716 B1 9/2004 Charych
7,460,439 B2 * 12/2008 Moon et al. ..................... 367/92
7,489,967 B2 2/2009 Von Arx et al.
7,606,621 B2 10/2009 Brisken et al.
7,610,092 B2 10/2009 Cowan et al.
7,687,976 B2 * 3/2010 Haider et al. ................. 310/334
7,902,943 B2 3/2011 Sherrit et al.
8,082,041 B1 12/2011 Radziemski
8,159,364 B2 4/2012 Zeine
8,649,875 B2 2/2014 Sarvazyan
2001/0035700 A1 11/2001 Percin et al.
2003/0020376 A1 1/2003 Sakaguchi et al.

(Continued)

FOREIGN PATENT DOCUMENTS

CN 102184729 A 9/2011
JP 07327299 A 12/1995

(Continued)

OTHER PUBLICATIONS

Intellectual Ventures,"MSA-T", Available at: http://www.intellectualventures.com/index.php/inventions-patents/our-inventions/msa-t. Date visited: Mar. 21, 2013.

(Continued)

*Primary Examiner* — Thomas Dougherty
(74) *Attorney, Agent, or Firm* — Morris & Kamlay LLP

(57) ABSTRACT

A first controller can have a greater number of output lines than a second controller has input lines. The first controller can receive an ultrasonic transducer control signal and provide a first portion of the control signal to the first processor, where the length of the first portion is less than or equal to the number of input lines of the second processor. The first processor can send portions of the control signal to a plurality of second processors. Each of the plurality of second processors can have a number of input lines less than the number of output lines of the first processor. Portions of the control signal can be sent through the output lines of the first processor to the plurality of second processors at substantially the same time.

7 Claims, 3 Drawing Sheets

(56) References Cited

U.S. PATENT DOCUMENTS

| | | | | |
|---|---|---|---|---|
| 2003/0048698 | A1* | 3/2003 | Barnes et al. | 367/181 |
| 2004/0066708 | A1 | 4/2004 | Ogawa | |
| 2004/0172083 | A1 | 9/2004 | Penner | |
| 2004/0204744 | A1 | 10/2004 | Penner et al. | |
| 2005/0070962 | A1 | 3/2005 | Echt et al. | |
| 2005/0207589 | A1 | 9/2005 | Biegelsen | |
| 2007/0109121 | A1 | 5/2007 | Cohen | |
| 2007/0150019 | A1 | 6/2007 | Youker et al. | |
| 2008/0184549 | A1 | 8/2008 | Nguyen-Dinh et al. | |
| 2008/0309452 | A1 | 12/2008 | Zeine | |
| 2010/0027379 | A1 | 2/2010 | Saulnier et al. | |
| 2010/0157019 | A1 | 6/2010 | Schwotzer et al. | |
| 2010/0164433 | A1 | 7/2010 | Janefalkar et al. | |
| 2010/0286744 | A1 | 11/2010 | Echt et al. | |
| 2010/0315045 | A1 | 12/2010 | Zeine | |
| 2011/0060225 | A1* | 3/2011 | Cogan et al. | 600/459 |
| 2011/0144494 | A1* | 6/2011 | Mehi et al. | 600/441 |
| 2012/0193999 | A1 | 8/2012 | Zeine | |
| 2012/0299540 | A1 | 11/2012 | Perry | |
| 2012/0299541 | A1 | 11/2012 | Perry | |
| 2012/0299542 | A1 | 11/2012 | Perry | |
| 2012/0300588 | A1 | 11/2012 | Perry | |
| 2012/0300592 | A1 | 11/2012 | Perry | |
| 2012/0300593 | A1 | 11/2012 | Perry | |
| 2013/0069865 | A1 | 3/2013 | Hart et al. | |
| 2013/0207604 | A1 | 8/2013 | Zeine | |
| 2013/0241468 | A1 | 9/2013 | Moshfeghi | |
| 2013/0271088 | A1 | 10/2013 | Hwang et al. | |
| 2014/0187960 | A1* | 7/2014 | Corl | 600/466 |

FOREIGN PATENT DOCUMENTS

| | | | |
|---|---|---|---|
| JP | 2008244964 | A | 10/2008 |
| KR | 10-2009-0118873 | | 12/2009 |
| WO | 00/21020 | | 4/2000 |
| WO | 2006/069215 | | 6/2006 |
| WO | 2012166583 | | 12/2012 |
| WO | 2012166583 | A1 | 12/2012 |

OTHER PUBLICATIONS

Intellectual Ventures,"MSA-T: Enabling affordable, all-electronic beam steering satcom user terminals", Available at: http://www.intellectualventures.com/assets_docs/IV_metamaterials_technical_overview.pdf. Visited on: Mar. 21, 2013, 2011.

Invitation to Pay Additional Fees and Partial International Search Report for PCT/US2014/028133 mailed Jul. 18, 2014.

Bao et al.,"High-power piezoelectric acoustic-electric power feedthru for metal walls", Proceedings of SPIE, vol. 6930, pp. 1-8, 2008.

Bao et al.,"Wireless piezoelectric acoustic-electric power feedthru", Proceedings of SPIE, vol. 6529, pp. 1-7, 2007.

Etherington,"Cota by Ossia Aims to Drive a Wireless Power Revolution and Change How We Think About Charging", Available at: http://techcrunch.com/2013/09/09/cota-by-ossia-wireless-power/. Date visited: Sep. 12, 2013, pp. 1-4, Sep. 9, 2013.

MobilityWire,"Ossia Unveils World's First Commercially Viable Remote Wireless Power System", Available at: http://www.mobilitywire.com/ossia/2013/09/10/7888. Date visited: Sep. 12, 2013, pp. 1-4, Sep. 10, 2013.

Sherrit et al.,"Cornparison of the Mason and KLM Equivalent Circuits for Piezoelectric Resonators in the Thickness Mode", IEEE Ultrasonics Symposium, vol. 2, pp. 921-926, 1999.

Sherrit et al.,"Efficient Electromechanical Network Models for Wireless Acoustic-Electric Feed-throughs", Proceedings of the SPIE Smart Structures Conference, vol. 5758, pp. 362-372, Mar. 6-10, 2005.

Sherrit et al.,"Solid Micro Horn Array (SMIHA) for Acoustic Matching", Proceedings of SPIE, vol. 6932, pp. 1-9, 2008.

Sherrit et al.,"Studies of Acoustic-Electric Feed-throughs for Power Transmission Through Structures", Proceedings of SPIE, vol. 6171, pp. 1-8, 2006.

Sherrit,"The Physical Acoustics of Energy Harvesting", IEEE International Ultrasonics Symposium Proceedings, pp. 1046-1055, 2008.

Germano,"Flexure Mode Piezoelectric Transducers", Morgan Electro Ceramics, Technical Publication TP-218. J. Acoust. Soc. Am. vol. 50, Issue 1A, pp. 1-6, 1971.

International Search Report in International Application No. PCT/US2012/039536, mailed Aug. 14, 2012.

Morgan Electro Ceramics,"Cantilever Mounted PZT 5A Bimorphs", Technical Publication TP-245, pp. 1-8, 1999.

* cited by examiner

ULTRASONIC TRANSDUCER CONTROL

BACKGROUND

Ultrasonic transducers receive electrical energy as an input and provide acoustic energy at ultrasonic frequencies as an output. An ultrasonic transducer can be a piece of piezoelectric material that changes size in response to the application of an electric field. If the electric field is made to change at a rate comparable to ultrasonic frequencies, then the piezoelectric element can vibrate, causing it to generate ultrasonic frequency acoustic waves.

BRIEF SUMMARY

A system for distributing information to ultrasonic transducers can include a first controller having 8 available first controller output lines that include a first subset of 4 first controller output lines. The system can include a second controller having 4 second controller input lines and 16 second controller output lines. The 16 second controller output lines can be electrically connected to a first set of ultrasonic transducers.

The first controller can be adapted and configured to receive a 16-bit ultrasonic transducer control signal. The first controller can separate the 16-bit ultrasonic transducer control signal into four 4-bit intermediate ultrasonic transducer control signals and send each of the 4-bit intermediate ultrasonic transducer control signals to the second controller through the first subset of 4 output lines.

The second controller can be adapted and configured to receive each of the four 4-bit intermediate ultrasonic transducer control signals through the 4 second controller input lines, to reassemble the 16 bit ultrasonic transducer control signal based on the received four 4-bit intermediate ultrasonic transducer control signals and to send the 16-bit ultrasonic transducer control signal through the 16 second controller output lines to the first set of ultrasonic transducers.

BRIEF DESCRIPTION OF THE DRAWINGS

The accompanying drawings, which are included to provide a further understanding of the disclosed subject matter, are incorporated in and constitute a part of this specification. The drawings also illustrate implementations of the disclosed subject matter and together with the detailed description serve to explain the principles of implementations of the disclosed subject matter. No attempt is made to show structural details in more detail than may be necessary for a fundamental understanding of the disclosed subject matter and various ways in which it may be practiced.

DETAILED DESCRIPTION

Figure 1:
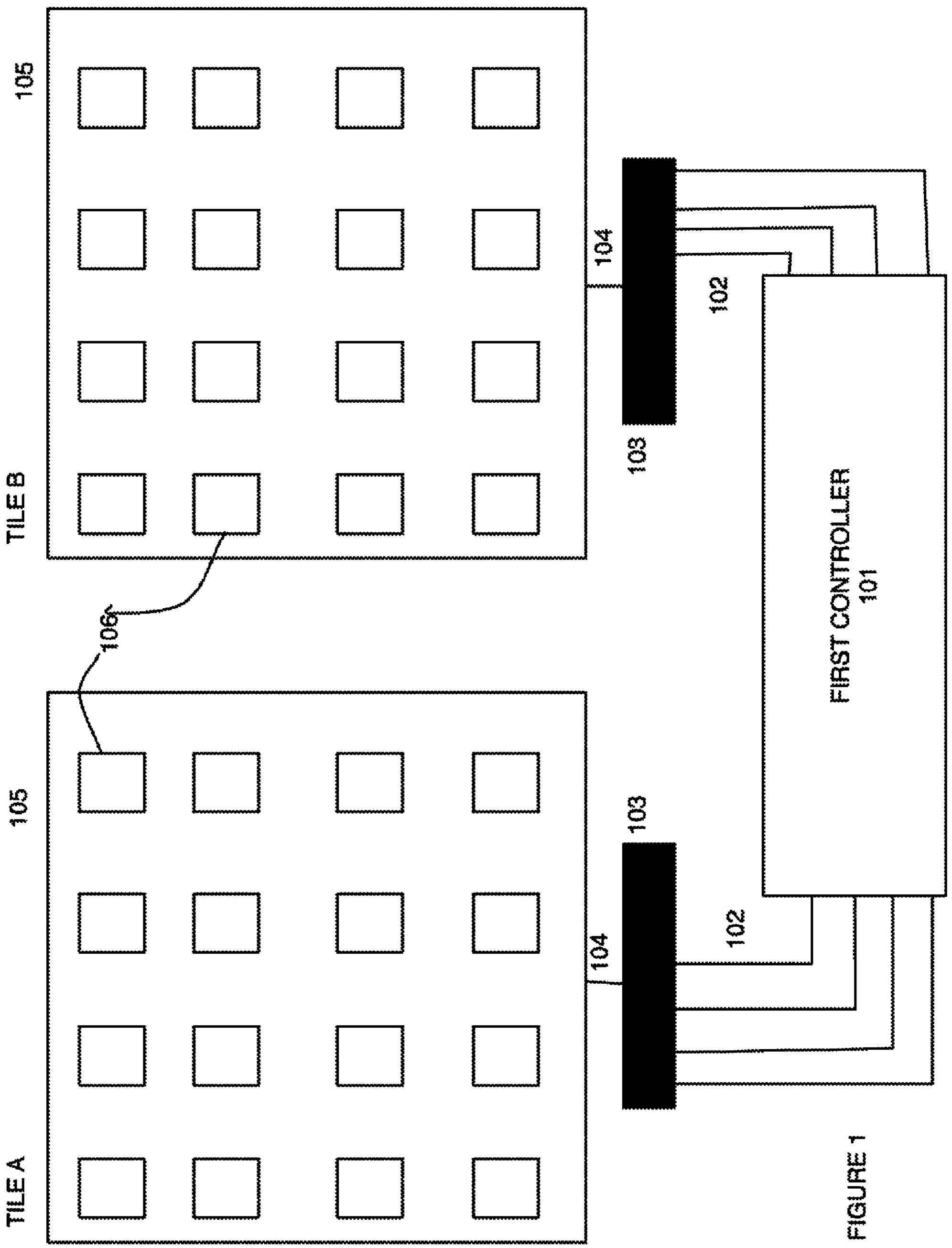
FIG. 1 shows first and two second controllers with two sets of ultrasonic transducers according to an implementation of the disclosed subject matter.

An implementation of the system in accordance with the present disclosure can include a first controller having a greater number of output lines than a second controller has input lines. The first controller can receive an ultrasonic transducer control signal and provide a first portion of the control signal to the first processor, where the length of the first portion is less than or equal to the number of input lines of the second processor. In an implementation, the first processor can send portions (which may be of different size) of the control signal to a plurality of second processors. Each of the plurality of second processors can have a number of input lines less than the number of output lines of the first processor. Not all of the plurality of second processors need have the same number of input lines or output lines. In an implementation, the portions of the control signal can be sent through the output lines of the first processor to the plurality of second processors at substantially the same time.

If the length of a control signal word is longer than the number of input lines of a second processor, the second processor can accumulate bits of the control signal received through the second controller input lines and assemble them into a control signal word. In an implementation, once the control signal word is assembled by the second processor, the control signal can be sent by the second processor to a set of ultrasonic transducers.

In an implementation, a first controller can have 8 available first controller output lines that can include a first subset of 4 first controller output lines. The system can include a second controller that can have 4 second controller input lines and 16 second controller output lines. The 16 second controller output lines can be electrically connected to a first set of ultrasonic transducers.

The first controller can receive a 16-bit ultrasonic transducer control signal. The first controller can separate the 16-bit ultrasonic transducer control signal into four 4-bit intermediate ultrasonic transducer control signals and send each of the 4-bit intermediate ultrasonic transducer control signals to the second controller through the first subset of 4 output lines.

The second controller can receive each of the four 4-bit intermediate ultrasonic transducer control signals through the 4 second controller input lines, reassemble the 16 bit ultrasonic transducer control signal based on the received four 4-bit intermediate ultrasonic transducer control signals and send the 16-bit ultrasonic transducer control signal through the 16 second controller output lines to the first set of ultrasonic transducers.

In an implementation, each of the 4 first controller output lines can transport one bit at a time of the 4-bit intermediate ultrasonic transducer control signal to the second controller. Each of the 16 second controller output lines can transport one bit of the 16-bit ultrasonic transducer control signal to one of the first set of ultrasonic transducers. Any or all of the ultrasonic transducers can be Capacitive Micromachined Ultrasonic Transducers (CMUT) and/or a hybrid transducer that uses a piezoelectric flexure, as disclosed in U.S. application Ser. No. 13/832,393, "Ultrasonic Transducer", filed on Mar. 15, 2013, and which is incorporated herein by reference.

An implantation is shown in FIG. 1. First controller 101 has first controller output lines 102 connected a second controllers 103. Second controller output lines 104 are connected to subsets 105 of ultrasonic transducers 106. Each second controller output lines 104 can include 16 lines, with each line connected to one of the ultrasonic transducers 106 shown in FIG. 1.

An implementation can include a first controller having $2^a$ available first controller output lines having a first subset of $2^b$ first controller output lines, where a>b.

a second controller having $2^b$ second controller input lines and $2^c$ second controller output lines, where b<c and each of the $2^c$ second controller output lines is electrically connected to a first set of ultrasonic transducers. The first controller can receive a $2^c$-bit ultrasonic transducer control signal, separate the $2^c$-bit ultrasonic transducer control signal into (c-b) $2^b$-bit intermediate ultrasonic transducer control signals and send each of the $2^b$-bit intermediate ultrasonic transducer control signals to the second controller through the first subset of $2^b$ output lines. The second controller can receive each of the (c-b) $2^b$-bit intermediate ultrasonic transducer control signals through the $2^b$ second controller input lines, reassemble the $2^c$ bit ultrasonic transducer control signal based on the received (c-b) $2^b$-bit intermediate ultrasonic transducer control signals and send the $2^c$-bit ultrasonic transducer control signal through the $2^c$ second controller output lines to the first set of ultrasonic transducers.

In an implementation, a first controller can have a larger number of available first controller output lines that can be divided into subsets of controller output lines, such as a first subset of such controller lines. A second controller can have a number of second controller input lines that is less than the number of first controller output lines. The second controller can also have any number of second controller output lines that can be electrically connected to a first set of ultrasonic transducers. The first controller can receive an ultrasonic transducer control signal that has any number of bits and separate it into subsets of intermediate ultrasonic transducer control signals. The intermediate ultrasonic transducer control signals can be sent to the second controller through the first subset first controller output lines. The second controller can receive each of the intermediate ultrasonic transducer control signals through some or all of the second controller input lines and reassemble the ultrasonic transducer control signal based on the received intermediate ultrasonic transducer control signals. The reassembled ultrasonic transducer control signal can be sent through the second controller output lines to the first set of ultrasonic transducers.

Figure 2:
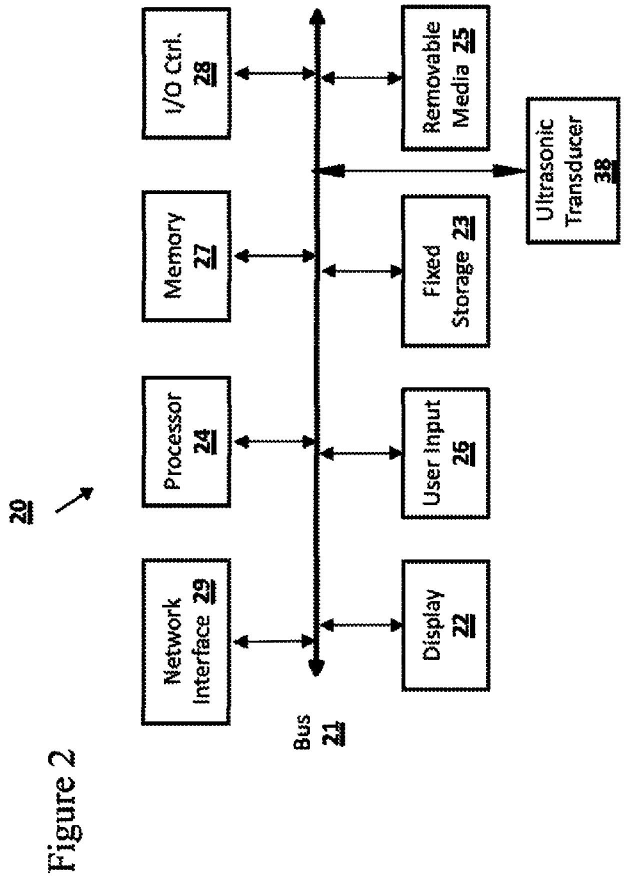
FIG. 2 shows a computer according to an implementation of the disclosed subject matter.

Implementations of the presently disclosed subject matter may be implemented in and used with a variety of component and network architectures. FIG. 2 is an example computer 20 suitable for implementations of the presently disclosed subject matter. The computer 20 includes a bus 21 which interconnects major components of the computer 20, such as a central processor 24, a memory 27 (typically RAM, but which may also include ROM, flash RAM, or the like), an input/output controller 28, a user display 22, such as a display screen via a display adapter, a user input interface 26, which may include one or more controllers and associated user input devices such as a keyboard, mouse, and the like, and may be closely coupled to the I/O controller 28, fixed storage 23, such as a hard drive, flash storage, Fibre Channel network, SAN device, SCSI device, and the like, and a removable media component 25 operative to control and receive an optical disk, flash drive, and the like.

The bus 21 allows data communication between the central processor 24 and the memory 27, which may include read-only memory (ROM) or flash memory (neither shown), and random access memory (RAM) (not shown), as previously noted. The RAM is generally the main memory into which the operating system and application programs are loaded. The ROM or flash memory can contain, among other code, the Basic Input-Output system (BIOS) which controls basic hardware operation such as the interaction with peripheral components. Applications resident with the computer 20 are generally stored on and accessed via a computer readable medium, such as a hard disk drive (e.g., fixed storage 23), an optical drive, floppy disk, or other storage medium 25. The bus 21 also allows communication between the central processor 24 and the ultrasonic transducer 38. For example, data can be transmitted from the processor 24 to a waveform generator subsystem (not shown) to form the control signal that can drive the ultrasonic transducer 39.

The fixed storage 23 may be integral with the computer 20 or may be separate and accessed through other interfaces. A network interface 29 may provide a direct connection to a remote server via a telephone link, to the Internet via an internet service provider (ISP), or a direct connection to a remote server via a direct network link to the Internet via a POP (point of presence) or other technique. The network interface 29 may provide such connection using wireless techniques, including digital cellular telephone connection, Cellular Digital Packet Data (CDPD) connection, digital satellite data connection or the like. For example, the network interface 29 may allow the computer to communicate with other computers via one or more local, wide-area, or other networks, as shown in FIG. 3.

Many other devices or components (not shown) may be connected in a similar manner. Conversely, all of the components shown in FIG. 2 need not be present to practice the present disclosure. The components can be interconnected in different ways from that shown. The operation of a computer such as that shown in FIG. 2 is readily known in the art and is not discussed in detail in this application. Code to implement the present disclosure can be stored in computer-readable storage media such as one or more of the memory 27, fixed storage 23, removable media 25, or on a remote storage location. For example, such code can be used to provide the waveform and other aspects of the control signal that drives a flexure.

Figure 3:
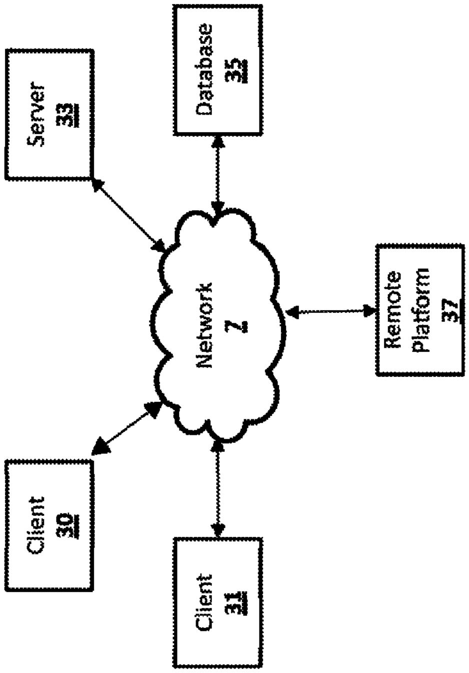
FIG. 3 shows a network configuration according to an implementation of the disclosed subject matter.

FIG. 3 shows an example network arrangement according to an implementation of the disclosed subject matter. One or more clients 10, 11, such as local computers, smart phones, tablet computing devices, and the like may connect to other devices via one or more networks 7. The network may be a local network, wide-area network, the Internet, or any other suitable communication network or networks, and may be implemented on any suitable platform including wired and/or wireless networks. The clients may communicate with one or more servers 13 and/or databases 15. The devices may be directly accessible by the clients 10, 11, or one or more other devices may provide intermediary access such as where a server 13 provides access to resources stored in a database 15. The clients 10, 11 also may access remote platforms 17 or services provided by remote platforms 17 such as cloud computing arrangements and services. The remote platform 17 may include one or more servers 13 and/or databases 15.

More generally, various implementations of the presently disclosed subject matter may include or be implemented in the form of computer-implemented processes and apparatuses for practicing those processes. Implementations also may be implemented in the form of a computer program product having computer program code containing instructions implemented in non-transitory and/or tangible media, such as floppy diskettes, CD-ROMs, hard drives, USB (universal serial bus) drives, or any other machine readable storage medium, wherein, when the computer program code is loaded into and executed by a computer, the computer becomes an apparatus for practicing implementations of the disclosed subject matter. Implementations also may be implemented in the form of computer program code, for example, whether stored in a storage medium, loaded into and/or executed by a computer, or transmitted over some transmission medium, such as over electrical wiring or cabling, through fiber optics, or via electromagnetic radiation, wherein when the computer program code is loaded into and executed by a computer, the computer becomes an apparatus for practicing implementations of the disclosed subject matter. When implemented on a general-purpose microprocessor, the computer program code segments configure the microprocessor to create specific logic circuits. In some configurations, a set of computer-readable instructions stored on a computer-readable storage medium may be implemented by a general-purpose processor, which may transform the general-purpose processor or a device containing the general-purpose processor into a special-purpose device configured to implement or carry out the instructions. Implementations may be implemented using hardware that may include a processor, such as a general purpose microprocessor and/or an Application Specific Integrated Circuit (ASIC) that implements all or part of the techniques according to implementations of the disclosed subject matter in hardware and/or firmware. The processor may be coupled to memory, such as RAM, ROM, flash memory, a hard disk or any other device capable of storing electronic information. The memory may store instructions adapted to be executed by the processor to perform the techniques according to implementations of the disclosed subject matter.

The foregoing description, for purpose of explanation, has been described with reference to specific implementations. However, the illustrative discussions above are not intended to be exhaustive or to limit implementations of the disclosed subject matter to the precise forms disclosed. Many modifications and variations are possible in view of the above teachings. The implementations were chosen and described in order to explain the principles of implementations of the disclosed subject matter and their practical applications, to thereby enable others skilled in the art to utilize those implementations as well as various implementations with various modifications as may be suited to the particular use contemplated.

The invention claimed is:

1. A system, comprising:

a first controller having 8 available first controller output lines comprising a first subset of 4 first controller output lines;

a second controller having 4 second controller input lines and 16 second controller output lines, the 16 second controller output lines electrically connected to a first set of ultrasonic transducers;

the first controller adapted and configured to receive a 16-bit ultrasonic transducer control signal, separate the 16-bit ultrasonic transducer control signal into four 4-bit intermediate ultrasonic transducer control signals and send each of the 4-bit intermediate ultrasonic transducer control signals to the second controller through the first subset of 4 output lines; and the second controller adapted and configured to receive each of the four 4-bit intermediate ultrasonic transducer control signals through the 4 second controller input lines, to accumulate the four 4-bit intermediate ultrasonic transducer control signals, to reassemble the 16 bit ultrasonic transducer control signal based on the received four 4-bit intermediate ultrasonic transducer control signals and to send the 16-bit ultrasonic transducer control signal through the 16 second controller output lines to the first set of ultrasonic transducers.

2. The system of claim 1, wherein each of the 4 first controller output lines transports one bit of the 4-bit intermediate ultrasonic transducer control signal to the second controller.

3. The system of claim 1, wherein each of the 16 second controller output lines transport one bit of the 16-bit ultrasonic transducer control signal to one of the first set of ultrasonic transducers.

4. The system of claim 1, wherein the ultrasonic transducers are Capacitive Micromachined Ultrasonic Transducers.

5. The system of claim 1, wherein the ultrasonic transducers are comprised of a piezoelectric flexure in communication with a membrane.

6. The system of claim 1, further comprising:

a second subset of 4 first controller output lines;

a third controller having 4 third controller input lines and 16 third controller output lines, each of the 16 second controller output lines electrically connected to each of a second set of ultrasonic transducers;

the first controller adapted and configured to receive a second 16-bit ultrasonic transducer control signal, separate the second 16-bit ultrasonic transducer control signal into four second 4-bit intermediate ultrasonic transducer control signals and send each of the second 4-bit intermediate ultrasonic transducer control signals to the third controller through the second subset of 4 output lines; and the third controller adapted and configured to receive each of the four 4-bit intermediate ultrasonic transducer control signals through the 4 third controller input lines, to accumulate the four 4-bit intermediate ultrasonic transducer control signals, to reassemble the second 16 bit ultrasonic transducer control signal based on the received second four 4-bit intermediate ultrasonic transducer control signals and to send the second 16-bit ultrasonic transducer control signal through the 16 third controller output lines to the second set of ultrasonic transducers.

7. A system, comprising:

a first controller having $2^a$ available first controller output lines comprising a first subset of $2^b$ first controller output lines, where a>b;

a second controller having $2^b$ second controller input lines and $2^c$ second controller output lines, where b<c and each of the $2^c$ second controller output lines is electrically connected to a first set of ultrasonic transducers;

the first controller adapted and configured to receive a 2c-bit ultrasonic transducer control signal, separate the 2c-bit ultrasonic transducer control signal into (c-b) $2^b$-bit intermediate ultrasonic transducer control signals and send each of the $2^b$-bit intermediate ultrasonic transducer control signals to the second controller through the first subset of $2^b$ output lines; and the second controller adapted and configured to receive each of the (c-b) $2^b$-bit intermediate ultrasonic transducer control signals through the $2^b$ second controller input lines, to accumulate the (c-b) $2^b$-bit intermediate ultrasonic transducer control signals, to reassemble the $2^c$ bit ultrasonic transducer control signal based on the received (c-b) $2^b$-bit intermediate ultrasonic transducer control signals and to send the $2^c$-bit ultrasonic transducer control signal through the $2^c$ second controller output lines to the first set of ultrasonic transducers.

* * * * *